(12) United States Patent
Park

(10) Patent No.: US 7,812,415 B2
(45) Date of Patent: Oct. 12, 2010

(54) APPARATUS HAVING GATE STRUCTURE AND SOURCE/DRAIN OVER SEMICONDUCTOR SUBSTRATE

(75) Inventor: Jeong-Ho Park, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 203 days.

(21) Appl. No.: 11/944,592

(22) Filed: Nov. 23, 2007

(65) Prior Publication Data
US 2008/0128836 A1 Jun. 5, 2008

(30) Foreign Application Priority Data
Dec. 5, 2006 (KR) .................... 10-2006-0121934

(51) Int. Cl.
*H01L 29/78* (2006.01)
(52) U.S. Cl. ............... 257/412; 257/357; 257/E21.167; 257/E21.203
(58) Field of Classification Search .......... 257/357, 257/E21.167, E21.203, 412
See application file for complete search history.

(56) References Cited

U.S. PATENT DOCUMENTS 6,890,823 B2 * 5/2005 Lee et al. .................... 438/300
2001/0046766 A1 * 11/2001 Asakawa .................... 438/648
2005/0098813 A1 * 5/2005 Sekiguchi et al. ........... 257/296
2005/0098831 A1 * 5/2005 Lee et al. .................... 257/357

* cited by examiner

*Primary Examiner*—Kenneth A Parker
*Assistant Examiner*—David Z Chen
(74) *Attorney, Agent, or Firm*—Sherr & Vaughn, PLLC

(57) ABSTRACT

A semiconductor device including a gate insulating layer formed over a semiconductor substrate; a gate insulating layer pattern formed over an exposed uppermost surface of the semiconductor substrate along the same horizontal plane as the gate insulating layer; an isolation insulating layer formed over the gate insulating layer; a plurality of first gate conductive patterns formed over the gate insulating layer and the gate insulating layer pattern; a source/drain conductor formed over an exposed uppermost surface of the semiconductor substrate; a second gate conductive pattern formed over one of the plurality of the first gate conductive patterns that is provided over the gate insulating layer pattern; a plurality of salicide layers formed over the second gate conductive pattern, the source/drain conductor, and at least one of the plurality of first gate conductive patterns that are provided over the gate insulating layer; and a pair of spacers formed over the gate insulating layer pattern and on sidewalls of one of the plurality of first gate conductive patterns that is provided over the gate insulating layer pattern, the second gate conductive pattern, and the plurality of salicide layers.

1 Claim, 4 Drawing Sheets

APPARATUS HAVING GATE STRUCTURE AND SOURCE/DRAIN OVER SEMICONDUCTOR SUBSTRATE

The present application claims priority under 35 U.S.C. 119 to Korean Patent Application No. 10-2006-0121934 (filed on Dec. 5, 2006), which is hereby incorporated by reference in its entirety.

BACKGROUND

Aspects of semiconductor technology have focused on obtaining highly integrated semiconductor devices. As semiconductor devices become more highly integrated, a plurality of MOS transistors may be formed on and/or over a single wafer. The MOS transistors may be isolated using isolation layers. These isolation layers may have a shallow trench insulation (STI) structure or a local oxidation of silicon (LOCOS) structure.

Figure 1:
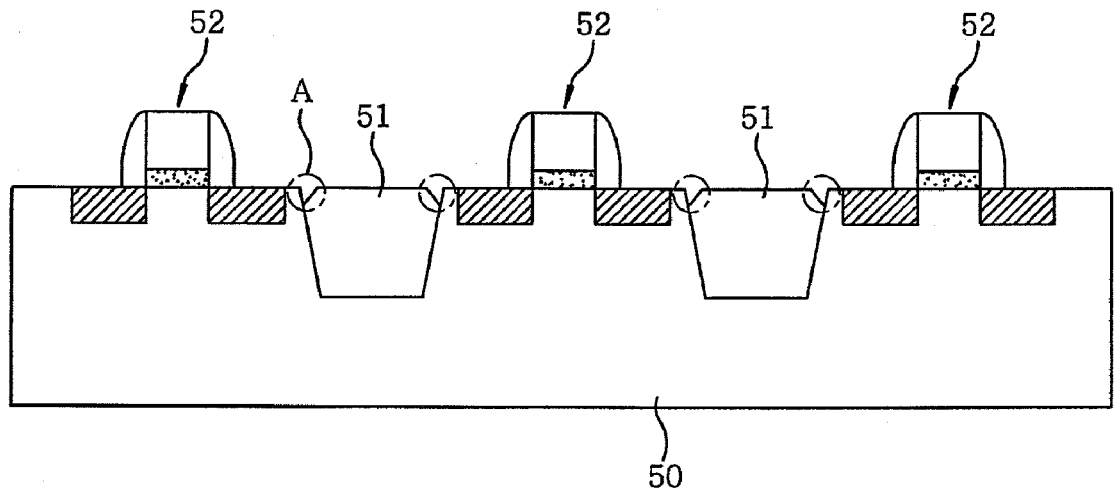

As illustrated in example FIG. 1, a semiconductor device may include a plurality of transistors 52 formed in semiconductor substrate 50. Isolation layers having STI structures 51 may be formed between transistors 52.

In order to form STI structure 51, a nitride layer and a photoresist pattern may be formed on and/or over substrate 50. The nitride layer may be dry etched using the photoresist pattern as an etch mask and substrate 50 may be etched using the nitride layer as an etch mask. An oxide layer may be deposited on and/or over trenches and substrate 50. The oxide layer and the nitride layer formed over substrate 50 may then be removed using a chemical mechanical polishing (CMP) process to thereby form STI structures 51. Therefore, a field region, i.e., an isolation region and an active region where a MOS transistor will be formed, may be separated from each other. A MOS transistor formation process may then be performed to form MOS transistors.

However, if transistors 52 are isolated using STI structures 51, additional isolation regions in which STI structures 51 will be formed have to be prepared. When fabricating such transistors it may become difficult to reduce source/drain resistance. Moreover, the characteristics of the semiconductor device may become degraded due to stress caused by the STI structure process. Even still, since STI structures 51 may be formed using CMP, divots "A" may be generated at the edges of STI structures 51. Divots "A" may cause a hump phenomenon and an inverse narrow width effect (INWE), so that semiconductor devices may operate abnormally. Yet and still, it may become difficult to control current leakage due to the STI structure edge portions.

SUMMARY

Embodiments relate to a method of fabricating a semiconductor device that can include at least one of the following steps: forming a gate insulating layer over a semiconductor substrate; sequentially forming a first gate conductor and an isolation insulating layer over the gate insulating layer; laminating a second gate conductive layer and a mask insulating layer over the first gate conductor and the isolation insulating layer; etching the first gate conductor, the second gate conductive layer, and the mask insulating layer to form a first gate conductive pattern, a second gate conductive pattern and a mask insulator; forming a spacer on sidewalls of the first gate conductive pattern, the second gate conductive pattern and the mask insulator; partially removing the gate insulating layer to expose the uppermost surface of the semiconductor substrate to form a gate insulating layer pattern; forming a source/drain conductor between the spacer and the isolation insulating layer; removing the mask insulator; and then forming a salicide layer over the second gate conductive layer and the source/drain conductor.

Embodiments relate to a semiconductor device that can include a gate insulating layer formed over a semiconductor substrate; a gate insulating layer pattern formed over an exposed uppermost surface of the semiconductor substrate along the same horizontal plane as the gate insulating layer; an isolation insulating layer formed over the gate insulating layer; a plurality of first gate conductive patterns formed over the gate insulating layer and the gate insulating layer pattern; a source/drain conductor formed over an exposed uppermost surface of the semiconductor substrate; a second gate conductive pattern formed over one of the plurality of the first gate conductive patterns that is provided over the gate insulating layer pattern; a plurality of salicide layers formed over the second gate conductive pattern, the source/drain conductor, and at least one of the plurality of first gate conductive patterns that are provided over the gate insulating layer; and a pair of spacers formed over the gate insulating layer pattern and on sidewalls of one of the plurality of first gate conductive patterns that is provided over the gate insulating layer pattern, the second gate conductive pattern, and the plurality of salicide layers.

DRAWINGS

Example FIG. 1 illustrates a semiconductor device having a plurality of transistors.

Example FIGS. 2 to 9 illustrate a semiconductor device and a method of fabricating the same, in accordance with embodiments.

DESCRIPTION

Figure 2:
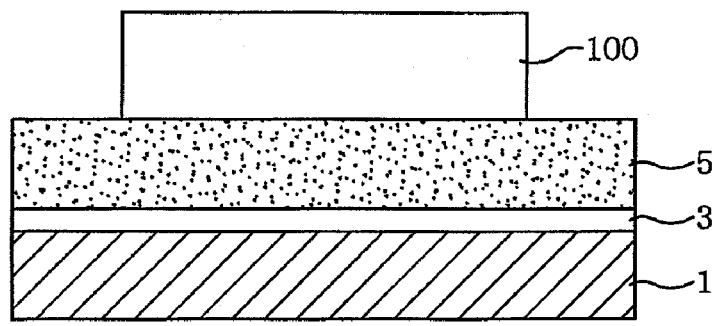

As illustrated in example FIG. 2, a semiconductor device in accordance with embodiments can be fabricated by sequentially forming gate insulating layer 3 and first gate conductive layer 5 on and/or over semiconductor substrate 1. Gate insulating layer 3 can be formed by depositing at least one of an oxide layer and a nitride layer on and/or over semiconductor substrate 1. First gate conductive layer 5 can be formed by depositing polysilicon on and/or over semiconductor substrate 1 including gate insulating layer 3.

Next, first photoresist can be formed on and/or over semiconductor substrate 1 including first gate conductive layer 5. Particularly, a photoresist layer can be coated on and/or over first gate conductive layer 5 and then exposure and development processes can be performed on the photoresist layer to form first photoresist film pattern 100.

Figure 3:
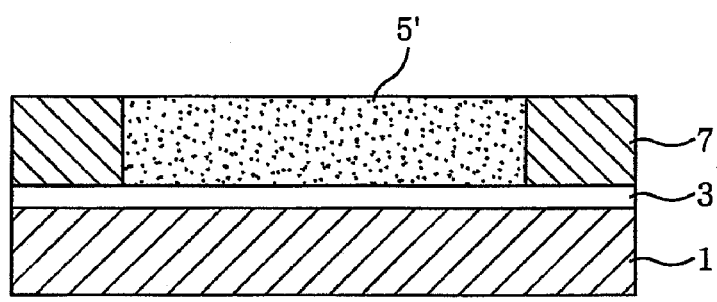

As illustrated in example FIG. 3, first gate conductive layer 5 can be etched using first photoresist film pattern 100 as an etch mask to form first gate conductor 5'. First photoresist film pattern 100 can be removed and an insulating layer is deposited on and/or over semiconductor substrate 1 including first gate conductive layer 5'. The insulating layer can be polished using a CMP process using first gate conductor 5' as an etch-stop film to form a pair of isolation insulating layers 7 at both sides of first gate conductor 5'.

Isolation layer 7 can be composed of at least one of an oxide-based material and a nitride-based material having a thickness between approximately 2000 to 5000 Å. First gate conductor 5' and isolation insulating layer 7 can have the same thickness.

Figure 4:
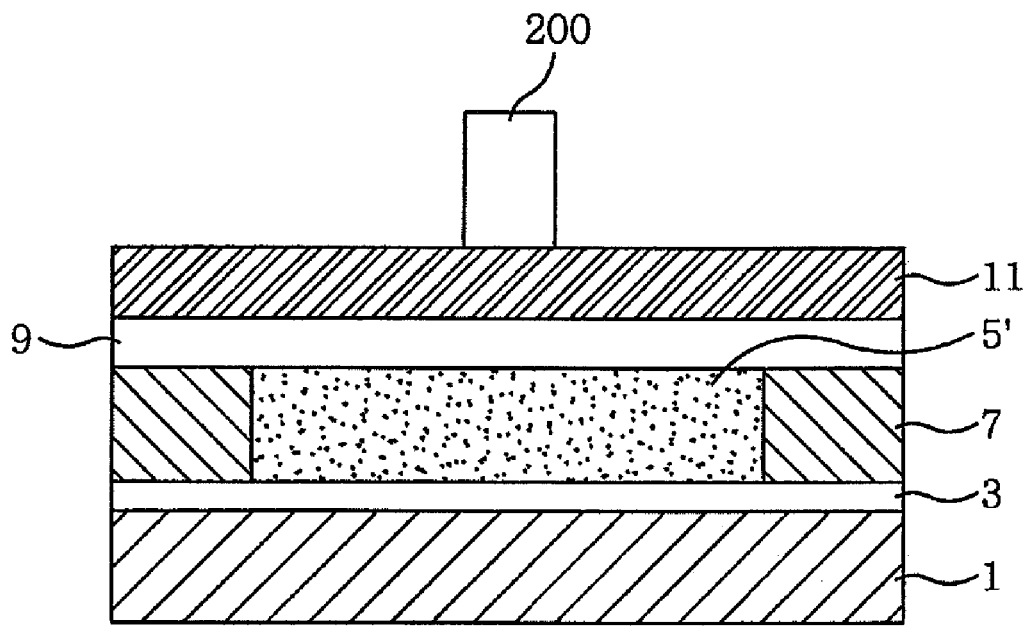

As illustrated in example FIG. 4, second gate conductive layer 9 and mask insulating layer 11 can be sequentially formed on and/or over semiconductor substrate 1 including isolation insulating layers 7 and first gate conductor 5'. Second gate conductive layer 9 can be composed of polysilicon and can serve to prevent a source and a drain from being bridged. The gate region becomes higher than the source/drain region due to second gate conductive layer 9. Mask insulating layer 11 can be composed of a nitride-based material.

In order to form a gate region, a photoresist layer can be coated on and/or over mask insulating layer 11 and exposure and development processes performed on the photoresist layer to form second photoresist film pattern 200.

Figure 5:
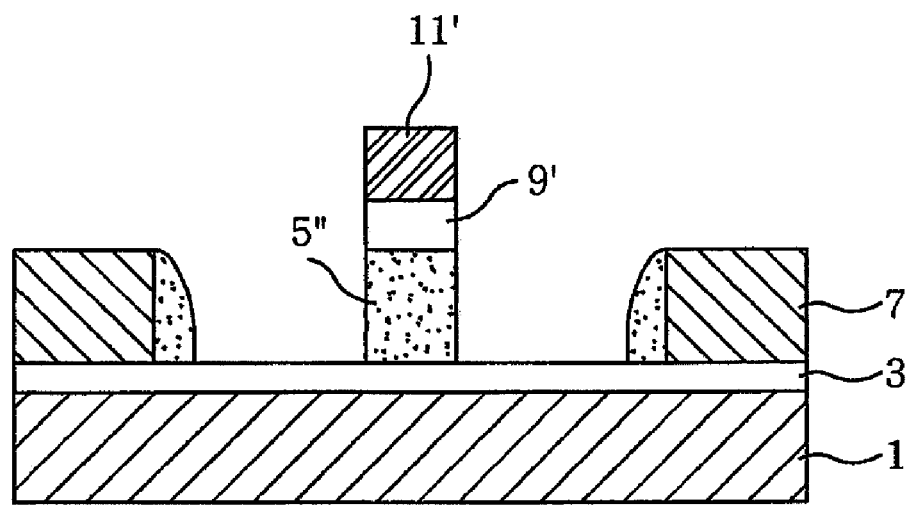
Figure 6:
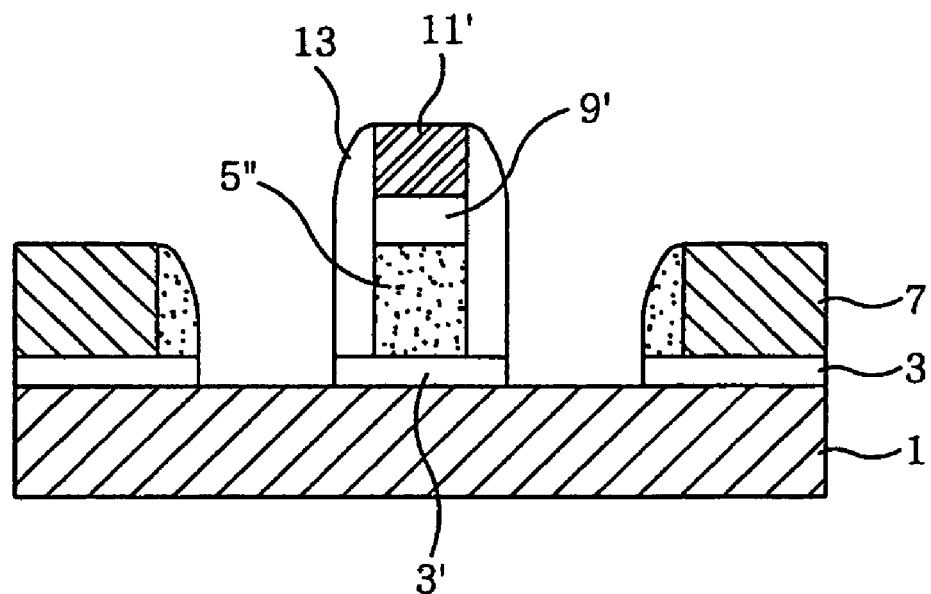

As illustrated in example FIGS. 5 and 6, mask insulating layer 11, second gate conductive layer 9, and first gate conductor 5' can then be etched by a dry etch method using second photoresist film pattern 200 as an etch mask. Second photoresist film pattern 200 can then be removed. When using the dry etch method, gate insulating layer 3 can be used as an etch-stop film. Thus, isolation insulating layers 7, which become the field region, and mask insulator 11', second gate conductive pattern 9', and first gate conductive patterns 5", which become the active region, can be formed on and/or over semiconductor substrate 1.

As illustrated in example FIG. 6, an oxide layer can then be deposited on and/or over semiconductor substrate 1 and is then etched by an etch-back method to form spacer film 13 on the sidewalls of first gate conductive pattern 5", second gate conductive pattern 9' and mask insulator 11' and on and/or over gate insulating layer pattern 3' which is formed under first gate conductive pattern 5".

Figure 7:
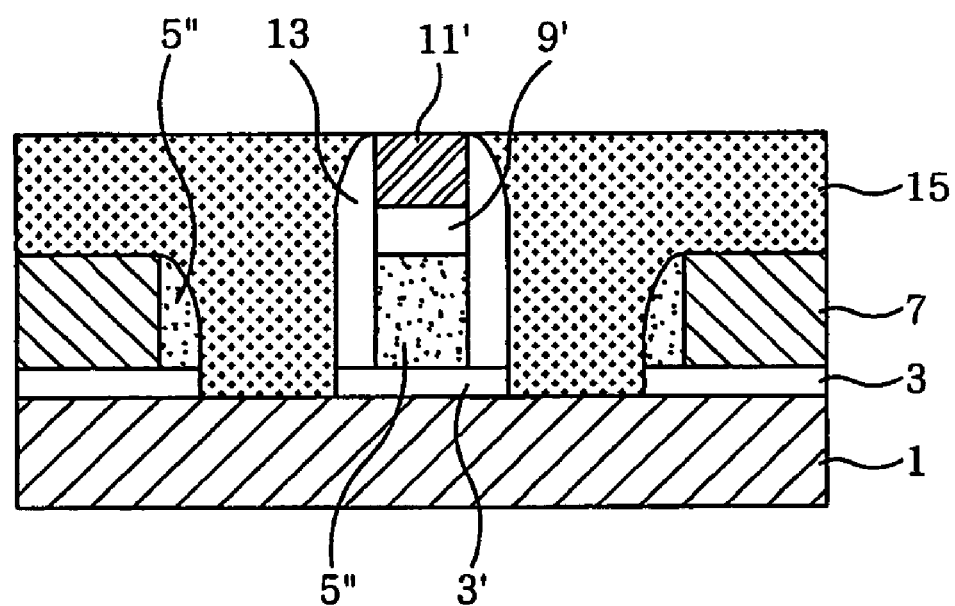

As illustrated in example FIG. 7, a spacer layer including an oxide layer can be deposited over semiconductor substrate 1. The spacer layer can be etched by an etch-back method to form a pair of spacers 13 on the sidewalls of mask insulator 11', second gate conductive pattern 9', and first gate conductive pattern 5".

A source/drain conductive substance such as polysilicon can then be deposited on and/or over semiconductor substrate 1 and then polished by a CMP process using mask insulator 11' as an etch-stop film to form source/drain conductive layer 15.

Figure 8:
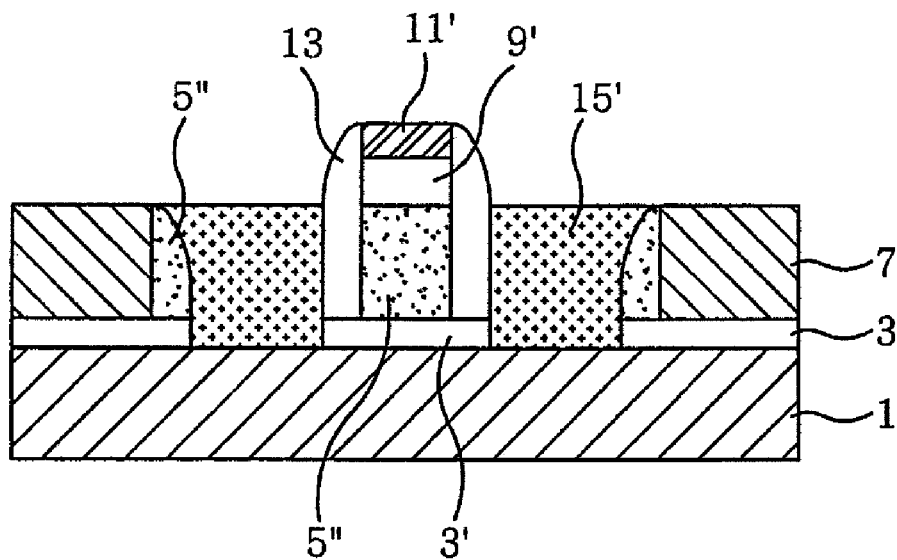

As illustrated in example FIG. 8, an etch-back can then be performed using isolation insulating layer 7 as an etch-stop film to form source/drain conductor 15' on and/or over semiconductor substrate 1. Upon etching using the etch-back process, isolation insulating layer 7 can be used as an etch-stop film in order that the thickness of source/drain conductor 15' is substantially the same as that of isolation insulating layer 7. Further, since second gate conductive pattern 9' can be formed on and/or over first gate conductive pattern 5" of the gate region, the height of the gate region is higher than that of source/drain conductor 15'. Accordingly, the bridge of the source and the drain can be prevented. Mask insulator 11' formed on and/or over second gate conductive pattern 9' is completely removed using a wet etch process to expose the uppermost surface of second gate conductive pattern 9'.

Figure 9:
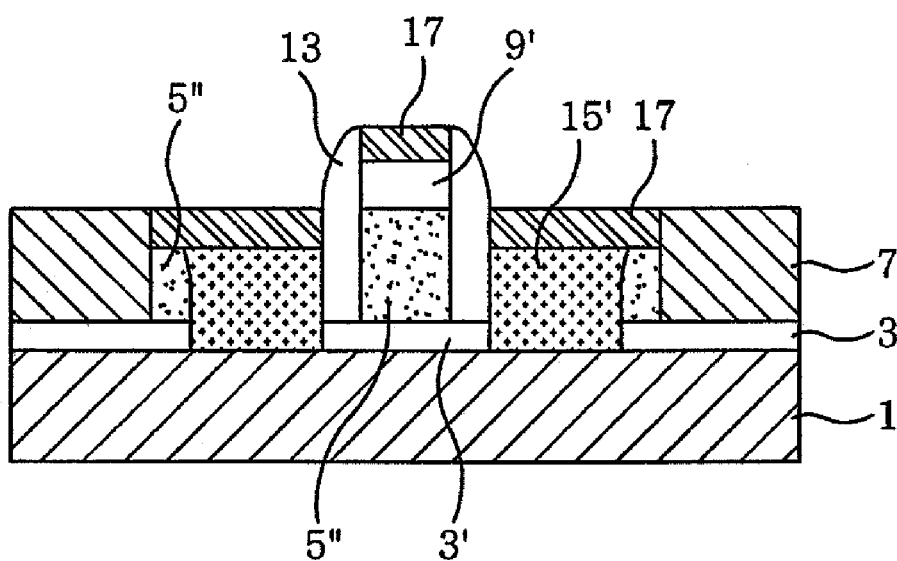

As illustrated in example FIG. 9, a metal layer composed of at least one of titanium, cobalt, tantalum and nickel-based material can be deposited on and/or over source/drain conductor 15' and second gate conductive pattern 9' to form salicide layer 17.

Salicide layer 17 can be formed using a physical vapor deposition (PVD) method. If a rapid thermal treatment (RTP) is performed, source/drain conductor 15' and second gate conductive pattern 9', which are both composed of polysilicon, react to the metal layer, thus forming salicide layer 17 which can lower the contact resistance between elements and lines. Thus, a semiconductor device having a field region and an active region is formed on and/or over semiconductor substrate 1.

In the semiconductor device in accordance with embodiments, a source/drain, a gate and an isolation insulating layer are formed on and/or over a semiconductor substrate to reduce resistance of the source/drain region and thereby enhance current flow. Furthermore, the source/drain region can be clearly divided by the gate to prevent current leakage and thereby enhance the reliability of semiconductor devices. Reliability can also be enhanced by forming the isolation insulating layer on and/or over the semiconductor substrate, which in turn prevents stress during the STI process, a divot phenomenon, and the current leakage generated at the STI edges.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
   a gate insulating layer formed over a semiconductor substrate, the gate insulating layer partially exposing an uppermost surface of the semiconductor substrate;
   a gate insulating layer pattern formed over a part of the exposed uppermost surface of the semiconductor substrate along the same horizontal plane as the gate insulating layer;
   an isolation insulating layer formed over the gate insulating layer;
   a plurality of first gate conductive patterns formed over the gate insulating layer and the gate insulating layer pattern;
   a source/drain formed over a part of the uppermost surface of the semiconductor substrate that is exposed between the gate insulating layer and the gate insulating layer pattern;

a second gate conductive pattern formed over one of the plurality of the first gate conductive patterns that is provided over the gate insulating layer pattern;

a plurality of salicide layers formed over the second gate conductive pattern, the source/drain and at least one of the plurality of first gate conductive patterns that are provided over the gate insulating layer; and a pair of spacers formed over the gate insulating layer pattern and on sidewalls of one of the plurality of first gate conductive patterns that is provided over the gate insulating layer pattern, the second gate conductive pattern, and the plurality of salicide layers, wherein one of the plurality of salicide layers is formed between the isolation insulating layer and one of the pair of spacers, wherein said one of the plurality of salicide layers is in direct contact with the source/drain, the isolation insulating layer, and said one of the pair of spacers, wherein an uppermost surface of the isolation insulating layer is formed along the same horizontal plane as an uppermost surface of said one of the plurality of salicide layers, and wherein an uppermost surface of one of the first gate conductive patterns that is provided over the gate insulating layer pattern is formed along the same horizontal plane as the uppermost surface of the isolation insulating layer.

* * * * *